United States Patent [19]
Keehn et al.

[11] Patent Number: 5,630,090
[45] Date of Patent: May 13, 1997

[54] APPARATUS FOR AND METHODS OF PROVIDING A SAFE-STOP MODE FOR A MICROPROCESSOR OPERATING IN A PSRAM-MEMORY ENVIRONMENT

[75] Inventors: William H. Keehn, Cedar Rapids; Robert B. Jaeger, Swisher, both of Iowa

[73] Assignee: Norand Corporation, Cedar Rapids, Iowa

[21] Appl. No.: 644,607

[22] Filed: Apr. 26, 1996

Related U.S. Application Data

[63] Continuation of Ser. No. 177,675, Jan. 5, 1994, abandoned.
[51] Int. Cl.$^6$ ............................................. G11C 7/00
[52] U.S. Cl. ........................ 395/433; 395/734; 395/750; 365/222; 365/227; 365/195
[58] Field of Search ................... 395/433, 734, 395/750; 365/222, 227, 195

[56] References Cited

U.S. PATENT DOCUMENTS 5,229,970  7/1993  Lee et al. ........................... 365/222

*Primary Examiner*—Eddie P. Chan
*Assistant Examiner*—Reginald G. Bragdon
*Attorney, Agent, or Firm*—Simmons, Perrine, Albright & Ellwood, P.L.C.

[57] ABSTRACT

A microprocessor circuit including a microprocessor device and pseudo-static RAM memory further includes a switching circuit which is coupled to an NMI signal port and to a RESET signal port of the microprocessor device. The switching device intercepts an NMI signal to be applied to the NMI port of the microprocessor device and converts an initial NMI signal following a power-down or sleep mode to a RESET signal and applies the RESET signal to the RESET signal port of the microprocessor device. NMI signals which occur during normal operation of the microprocessor circuit are routed through the switching device directly to the microprocessor circuit consistent with normal operations. The RESET signal after power-down or sleep mode operations causes the microprocessor device to address ROM until after the pseudo-static RAM memory has assumed an active, externally refreshed state.

28 Claims, 3 Drawing Sheets

APPARATUS FOR AND METHODS OF PROVIDING A SAFE-STOP MODE FOR A MICROPROCESSOR OPERATING IN A PSRAM-MEMORY ENVIRONMENT

CROSS REFERENCE TO RELATED APPLICATION

This application is a continuation of application Ser. No. 08/177,675 filed Jan. 5, 1994, now abandoned.

BACKGROUND OF THE INVENTION

This invention relates generally to microprocessor control systems, and more particularly to microprocessor control systems which include features, such as intermittent power-saving states. Such power-saving features may be of particular advantage, for example, in microprocessor-controlled equipment which is portable and which is intended to operate on self-contained power sources for extended periods of time.

Certain state-of-the-art portable microprocessor-controlled types of apparatus may operate in conjunction with static memory to retain application programs and operational states during times of shutdown. Retention of operational states may be particularly desirable for portable microprocessor-controlled apparatus. For certain rechargeable battery packs, a deep discharge is desired to prevent a loss of power storage capacity. Even if the portable apparatus operates on rechargeable battery packs, it is often considered more convenient from a user standpoint to be able to exchange a battery pack which has exhausted its charge for a fully charged battery pack, rather than to take time to recharge the battery pack which has exhausted its charge.

Static RAM devices, i.e., electronic memory devices which retain their memory cell states without refresh pulses, appear ideally suited to save application programs and microprocessor states during periods of a complete power-down condition of a microprocessor controlled apparatus. A retention of program and microprocessor states on power-down occurrences (for whatever the reason) further permits a user to resume operation, after subsequent power-up of a respective microprocessor controlled apparatus, just where the operation had been interrupted by the earlier power-down occurrence.

Unfortunately, static RAM devices are often considered, in an overall system perspective, to be comparatively costly and, moreover, the devices are also relatively large in physical size. The physical size of the memory devices in turn affects the physical size of apparatus that houses them. A resultingly relatively large unit is, however, less desirable than a comparatively smaller one when the units are intended to be handheld, as, for example, portable data collection terminals of an information retrieval system.

An alternative to using static RAM devices for saving application programs and microprocessor states during intermittent power-down states, is use of pseudo-static memory devices which are known as "PSRAM" devices. PSRAM devices require a refresh operation, very much like typical dynamic memory (DRAM) devices, often referred to as random access memory or simply as RAM devices. Thus, during normal operation, a memory management unit (MMU) periodically, for example at twelve microsecond intervals, addresses all locations of the memory with refresh pulses. Whenever an apparatus shutdown occurs, a controlling microprocessor (CPU) may cause the MMU to discontinue the application of refresh pulses. When the refresh pulses from the MMU no longer occur at the PSRAM, the PSRAM goes into what is referred to as a "self-refresh" mode. In the self-refresh mode, memory states of, or data within, the PSRAM are retained by internal refresh operations which require substantially less power than a continuation of refresh operations via the memory management unit (MMU).

A serious operational flaw occurs when a microprocessor device (CPU), which requires code access at the top of addressable RAM after a non-maskable interrupt, is sought to be operated in a memory environment consisting entirely of PSRAM devices. PSRAM devices, upon entering a data preserving self-refresh mode or state, become inaccessible to a CPU until they have been restored to a normal operating mode, in which mode the memory devices are refreshed by externally provided refresh pulses, such as by a MMU. In typical power-saving modes of operation, a respective CPU, such as an NEC V25, for example, is placed into a safe-stop state, which permits all operations to be shut down pending receipt of a non-maskable interrupt (NMI). The CPU, on receiving such an NMI "wake-up" signal, seeks to fetch a 4-byte address (referred to as a "vector") from an interrupt vector table (IVT) at the beginning of memory, which in a pseudo-static memory environment would be the PSRAM. Since the PSRAM at that time has not been placed into its normal operational mode, stored data may be lost, and the CPU may not be able to continue its operation.

Some computer systems use memory devices other than PSRAM in critical memory locations to be addressed by the microprocessor after shut-down. However, it appears to be desirable, among other reasons for simplicity sake, as well as from a standpoint of design considerations, to provide a microprocessor system with intermittent microprocessor shutdown states and with a capability of functioning in a memory environment of PSRAM devices.

Referring to FIG. 1, there is shown a microprocessor circuit which is designated generally by the numeral 10. A controlling circuit element of the microprocessor circuit 10 is a microprocessor device 12 which may be placed into a power-saving mode referred to as a sleep mode. As used herein, the term sleep mode refers to a shutdown mode of the microprocessor device 12, as distinguished from a stand-by mode, in which the microprocessor device 12 is not completely shut down, but operates in a slow, power-saving mode. The invention is described in reference to a microprocessor circuit which uses an "NEC V25" as a preferred example for implementing features of the invention. It is to be understood that other microprocessor devices may be used in implementing features of the invention and in achieving the advantages referred to herein. However, the V25 microprocessor device 12, depicted schematically in FIG. 1, has been found to satisfy adequately the requirements of implementing the invention as described herein.

In reference to both FIGS. 1 and 2, FIG. 2 relates to operations of the microprocessor device 12 of FIG. 1, wherein the microprocessor obtains operational data either from permanent memory, such as read-only memory 14 (ROM), or from static memory 15 (Static RAM). Both the ROM 14 and the Static RAM 15 are coupled in a known and typical manner to respective data and control ports of the microprocessor device 12 via a typical data and control bus 16, as shown by the "data and Control BUS" arrow and its coupling extensions labelled "B". Open arrowheads 17 and 18 identify the bus 16 as extending typically to further input-output ports and related microprocessor circuit elements or functional devices, such as disk drives or communications circuits coupled to respective ports. The use of these devices or circuits, also referred to as peripherals, is well-known in the art, but their selection is usually one of choice. Thus, the presence of selected peripherals is schematically shown by the respective arrows 17 and 18.

The microprocessor device 12 operates in a controlled sequence of operations as dictated by a control program found by selectively accessing memory locations of the ROM 14 and the Static RAM 15. The state of operations (or temporary wait periods) may be interrupted by signals appropriately referred to as "interrupts" or interrupt signals. An interrupt signal which requires action by the microprocessor device 12 is known as a "non-maskable interrupt" signal, or "NMI" signal. An NMI signal alerts the microprocessor device 12 to a) check for what type of interrupt signal has been received, and b) to perform an operation or to respond as prescribed by the control program when the presence of the particular type of interrupt signal has been indicated.

Two types of operations by the microprocessor device 12 are of interest in describing the invention. A first type of operation is a standard POWER-ON RESET. A power-on reset occurs typically on each start-up, typically a "cold start", when the power is first applied to the microprocessor circuit 10. All circuit devices or functional units coupled to and forming an integral part of the microprocessor circuit 10 are generally reset when power is first applied to them. This may be true, even though it may be desirable to then reload saved application program parameters into memory or other elements, so as to continue with an operation at a point at which the operation was interrupted prior to the most recent shut-down. To assure a "clean start", the power-on reset applied to the microprocessor device 12 is a logical "low" signal which is sustained for a period of "substantial" length following the application of power to the microprocessor circuit 10 to allow all circuit elements to be ready for operation before the clock signal triggers the microprocessor into action. Thus, system voltage (VCC) is applied to a reset port 21 of the microprocessor device 12 via an RC delay circuit 21 which has a time constant to generate, in the preferred example, a delay of 100 milliseconds. During the initial "power-on reset" period, the receipt of an non-maskable interrupt (NMI) signal is undesirable and might interfere with the proper reset operation. Consequently, an NMI signal input line 23 to an NMI port 24 of the microprocessor device 12 is AND-gated at an AND-gate 25 with an NMI holdoff RC delay circuit 26. The time constant of the RC delay circuit 26 is chosen to generate on start-up a time delay which blocks NMI signals for a time period following power-up of the circuit 10, causing an output of the AND-gate 25 (via signal line 27) to remain low during the period of the delay. In a preferred embodiment, the duration of the NMI holdoff is chosen to be 500 milliseconds, for example.

In a normal start-up of the microprocessor 10, to arrive at running an applications program, as shown by the "RUN PROGRAM" state 30 in FIG. 2, the microprocessor circuit 10 either follows a path via an "OFF" state 31 and a "POWER ON RESET" state 32, or from a "SAFE STOP" state 33 via a "WAKE-UP NMI" state 34. Except for an initial operation of the microprocessor circuit 10, a start-up via the "POWER ON RESET" state 32 also originates from the "SAFE STOP" state 33. A difference in the start-up procedure is that on a reset, the microprocessor 12 accesses the ROM memory locations 14, while on resuming operation after a WAKE-UP NMI 34, the microprocessor 12 jumps to an interrupt vector table which would typically be located at the lowest memory locations of the Static RAM memory 15.

While running a program, i.e., while being in the normal operational state 30, the microprocessor circuit 10 may be programmed to time out after a set time interval of non-interventive activity by an operator, for example after a period of one minute during which the microprocessor 12 has not received a keyboard entry NMI. A resulting time-out path to the "SAFE STOP" state 33 is shown by a direct path 35. Another path to the "SAFE STOP" state 33 is shown via a "SHUT-DOWN NMI" state 36. If the time-out timer for initiating a safe stop, or sleep mode, in the microprocessor 12 initiates a time-out NMI, the time out path 35 may be considered to be identical with the path via the "SHUT-DOWN NMI" state 36. A typical shut-down NMI, other than the time-out NMI, may be caused, for example, by a "low battery" indication. Another reason for the microprocessor 12 receiving a shut-down NMI 36 may be because of a sudden impending power loss, other than one caused by a steadily discharging battery. An indication of such a sudden power loss to the microprocessor circuit 10 may originate, for example, from a hardware safety switch coupled to a power pack compartment or connection. In all instances of receiving a time-out 35 or shut-down NMI 36, the microprocessor circuit 10 would be instructed to stop operating in any applications program and immediately store all, then current, operating parameters in, for example, separately battery-backed memory, or other non-volatile memory for future recall. Any start-up after reaching the "SAFE STOP" state 33, be it via the "POWER ON RESET" 32 or via the "WAKE-UP NMI" 34 permits a user to restore the most recent state of operation of the microprocessor circuit 10, thus, resume operations where they had been left off prior to the microprocessor 12 entering the sleep mode. Use of the above-described power-saving sleep mode operation presupposes the presence of non-volatile memory for storing all necessary operating parameters while the microprocessor is in the sleep mode. Moreover, it presupposes ready accessibility of such non-volatile memory to recall the operating parameters when resumption of operations by the microprocessor 12 is called for.

Since pseudo-static RAM memory requires to be re-activated from its self-refresh mode before it may and can be accessed by a microprocessor to retrieve or store data, the use of pseudo-static RAM memory in place of the Static RAM memory 15 as described with respect to FIG. 1 has been found to present operational problems.

SUMMARY OF THE INVENTION

It is therefore a general object of the invention to provide circuit functions which allow a CPU which has a safe-stop mode to become operational, after a safe-stop shutdown, even though the CPU is operating in a circuit environment which uses pseudo-static RAM (PSRAM) memory.

It is yet another object of the invention to provide an interface function for delaying access by a CPU to PSRAM memory until after such PSRAM memory has been restored to normal addressable operation with externally applied refresh signals.

It is therefore a further object of the invention to provide a power-saving mode for a CPU or microprocessor which resumes its normal operation from a safe-stop mode on receipt of an NMI signal by addressing PSRAM memory locations.

According to the invention, a microprocessor circuit includes a CPU which has a RESET signal port and a non-maskable interrupt (NMI) signal port. The CPU is operable to execute a start-up sequence to a CPU-active state from a ROM memory address in response to receipt of a RESET signal applied to the RESET signal port, and is further operable to resume operation in the CPU-active state RAM upon leaving a power-saving safe-stop state in response to receipt of an NMI interrupt at the NMI signal port. The microprocessor circuit further includes addressable ROM, PSRAM and a memory management unit (MMU). The MMU is communicatively coupled via the data and control bus to the CPU. An NMI-RESET switch circuit arrangement includes a switch for passing an NMI signal, which occurs while the CPU is in the CPU-active state, to the NMI signal port as a typical operation in the CPU-active state, and which routes an NMI signal occurring while the CPU is in the safe-stop state to the RESET to a signal generator which generates an NMI-generated RESET signal which is applied to the RESET signal port. On receiving the NMI-generated reset signal, the CPU executes a start-up operation from ROM. The start up operation includes a provision for activating PSRAM and for delaying the CPU-active state until after PSRAM has become active.

Other features and advantages of the invention will become apparent from reading the detailed description below.

BRIEF DESCRIPTION OF THE DRAWINGS

The detailed description of the invention may be read in reference to the appended drawing wherein.

DETAILED DESCRIPTION OF THE INVENTION

Figure 3:
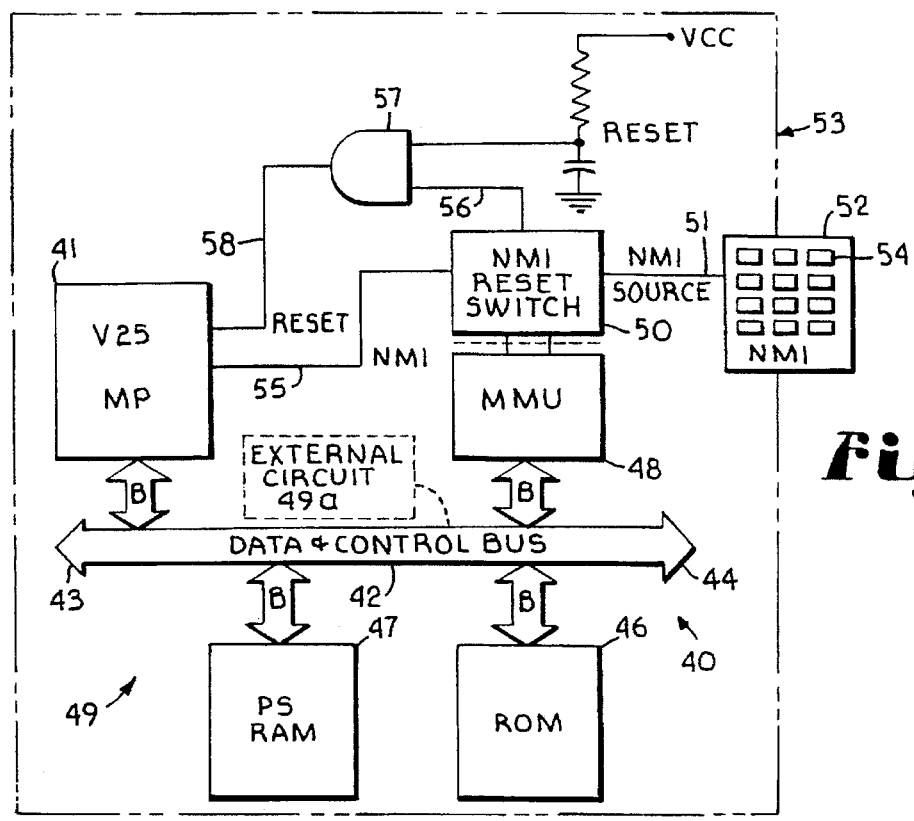
FIG. 3 is a schematic block diagram representing a microprocessor circuit operable with a sleep mode and in a memory environment of pseudo-static RAM (PSRAM) devices in accordance with the invention.

FIG. 3 shows a schematic diagram of a control circuit 40, and particularly a microprocessor circuit 40, which overcomes such operational problems. The microprocessor circuit 40 includes a control device, particularly a microprocessor device 41 ("V25 MP"), which operates by accessing and communicating with memory locations and input/output devices via a communications and address bus 42, as schematically represented by arrows identified as "DATA & CONTROL BUS" and their respective extensions identified as "B". Electrical connections via a plurality of data and control lines generally communicatively couple selected devices by device addresses or control signals. Specific data signals may be communicated between, for example, the microprocessor device 41 and another selected device via the data and control bus 42. The placed address signal uniquely identifies a particular device or a memory location to which the corresponding data signal may be written, or from which data signals such as one or more data bytes may be fetched. Additional I/O capabilities to couple any of a number of available devices to the data and control bus 42 are schematically indicated by the open arrows heads 43 and 44 of the bus 42. Memory locations, wherein a control program or BIOS code is stored, may be a typical masked, i.e., permanent, read only memory, or an electrically changeable FLASH read-only memory, shown as "ROM" memory 46. Read-and-write memory accessed by the microprocessor device 41 during normal operations for storing or retrieving data may be comprised of, in accordance with the present invention, entirely of pseudo-static RAM, shown as "PS RAM" memory 47. The term "pseudo-static memory" as used herein is that type of electronic memory which has a normal or active operating mode during which the memory cells of the memory 47 are periodically refreshed by refresh pulses applied from an external pulsing source. During the active mode, the memory is addressable and accessible to write data into and retrieve data from respectively addressed memory cells. External refresh pulses, which are required during an active state of the pseudo-static RAM memory 47, are generated in the preferred embodiment by the microprocessor device 41 (V25 MP). The refresh pulses are routed to the pseudo-static memory 47 via a memory management unit "MMU" 48, such as via the data and control bus 42. It should be understood that the data and control bus 42 represents typical address and pulse connections which are coupled to respective address and signal ports on individual devices of the pseudo-static memory 47. In general, an external refresh operation for the pseudo-static memory 47 may be provided by a circuit or network including a refresh pulse generator and a refresh pulse distributor as indicated by arrow 49 in FIG. 3. The refresh pulse network would be coupled to the memory 47 to address and distribute refresh pulses to individual memory cells of the memory 47 in predetermined refresh intervals. The periodically applied refresh pulses are required to maintain the pseudo-static memory 47 externally refreshed and active. The combination of the microprocessor circuit 41, the coupling network of the data and control bus 42, and the memory management unit 48 could, for example, be a single integrated circuit coupled to respective refresh ports of the memory 47. In another embodiment, a refresh pulse generator may be a circuit as indicated by dotted box 49a in FIG. 3 separate from the microprocessor device 41, and the microprocessor device 41 as a control device may control the refresh pulse distributor or memory management unit 48. According to the preferred and described embodiment, the memory management unit 48 distributes the refresh pulses to the pseudo-static RAM memory 47 to maintain the memory 47 active. During an inactive state, whenever the external refresh pulses are not applied to the pseudo-static RAM memory 47, the memory 47 enters a self-refresh mode. In the self-refresh mode, the power consumption of the pseudo-static RAM memory 47 is at a minimum and the presence of normal system power is not required. However, in such self-refresh mode, the pseudo-static RAM memory 47 is not accessible for storing or retrieving information, as, for example, by the microprocessor device 41 during routine operations. Therefore, on any start-up, whether from a power-saving sleep mode or from an OFF condition in which battery power was either removed or disconnected, the pseudo-static RAM memory 47 needs to be restored to an active, externally refreshed, condition before it can be addressed by the microprocessor device 41.

On Reset, the microprocessor device 41 obtains initial operating instructions from masked memory (ROM) 46. However, a typical wake-up NMI would cause the microprocessor device 41 to seek access to the pseudo-static memory 47 before the memory 47 might be restored to its active state. The microprocessor circuit 40 includes advantageously an NMI switch ("NMI RESET SWITCH") 50 or switching circuit 50. The switching circuit 50 is controllable to distinguish between NMI signals, which are applied after an interruption of power to the microprocessor circuit 40, and those NMI signals which occur in the course of normal operation of the microprocessor circuit 40. As may have become adequately apparent from the above discussion, prior power interruptions, i.e., those which have caused the pseudo-static memory 47 to go into its self-refresh mode, require a significant delay to be imposed on commencement of operation by the microprocessor device 41, such as the delay generated by the described reset operation. A "POWER-ON RESET" provides for the pseudo-static memory 47 to become activated before the microprocessor device 41 seeks access to the memory 47.

On first glance a simple solution appears to be to route all NMI signals through a "POWER ON RESET" as described above in reference to FIG. 2. Closer examination reveals that to use the reset delay route also requires that the microprocessor circuit first be placed into a "SAFE STOP" state as described above. Such cumbersome and time consuming operation would be less than desirable if made applicable to all NMI signals during normal microprocessor operations. The routing of all NMI signals through actual or simulated device reset operations may, however, be circumvented by the intervening function of the switching circuit or NMI switch 50.

The NMI switch 50 receives an NMI signal via an "NMI SOURCE" port or connection 51. The NMI signal may have originated at any NMI source, hence any device capable of sending an NMI signal, a schematically drawn keyboard 52 representing generically any and all such NMI sources. Using the keyboard 52 as an example of an NMI source for itself, the keyboard 52 may be a keyboard of a portable data device, such as a hand-held data collection terminal 53, represented schematically by the box 53 drawn in phantom lines and enclosing the microprocessor circuit 40. A depression of any key 54 of the keyboard 52 would cause an NMI signal to be sent to the microprocessor device 41. As shown in FIG. 3, the NMI switch 50 intercepts all NMI signals and changes the operation of the microprocessor circuit 40 by converting all power-up related NMI signals to power-up reset signals, while passing all other NMI signals via an NMI port or connection 55 directly to the microprocessor device 41. The switch 50 converts, for example, a "wake-up" NMI in a pulse-shaping operation to a reset signal while inhibiting the application of the NMI signal to the microprocessor circuit 41. The reset signal generated by the NMI switch 50 is a logical low signal which is sustained for the prescribed reset period. The generated reset signal becomes gated via an input port 56 of an AND-gate 57 to a reset port 58 of the microprocessor device 41.

Figure 4:
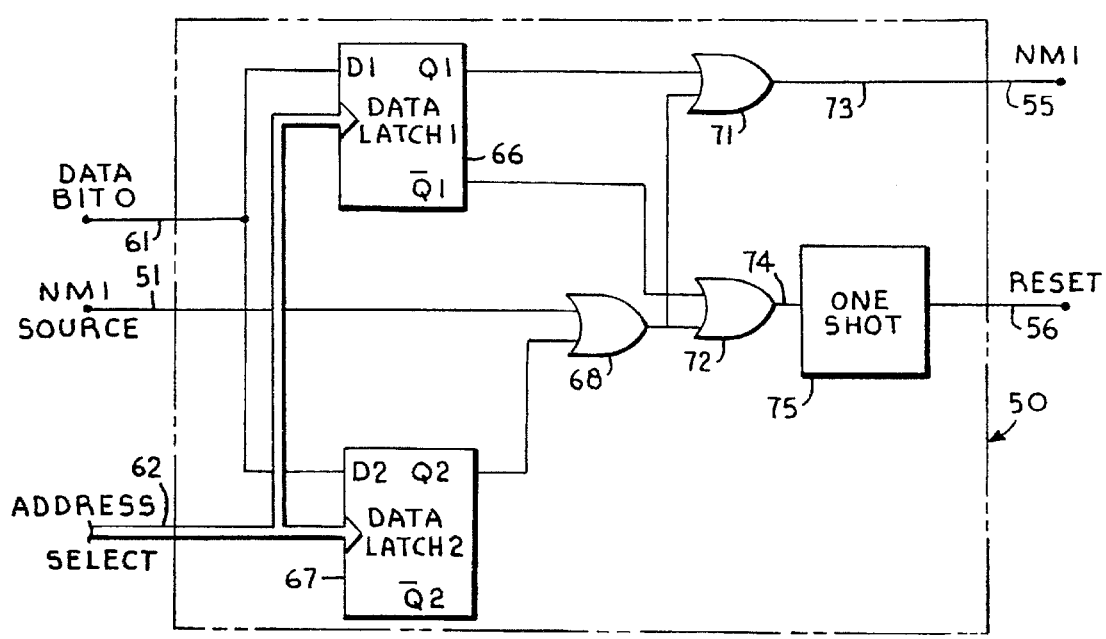
FIG. 4 is a schematic diagram of an non-maskable interrupt reset switch (NMI-RESET SWITCH) shown in FIG. 3.

FIG. 4 is a schematic representation of functional elements of the NMI switch 50. It should be understood that the NMI switch 50 may, in a preferred embodiment, be physically integrated on the silicon chip of the memory management unit 48 (see FIG. 3), though the NMI switch 50 may be separate, at least functionally, as indicated by the interface dotted line, also shown in FIG. 3. In a preferred embodiment, the NMI switch 50 receives device select and data input signals via the data and control bus 42 or directly from the memory management unit 48. Further in reference to FIG. 4, input signals shown on the left-hand side of the NMI switch 50 are the NMI signal source port 51, a data bit source or a data port 61 ("DATA BIT 0"), and a device select ("ADDRESS SELECT") bus connection 62.

In reference to FIGS. 3 and 4, a data bit at the data port 61 is read either into data port "D1" or into data port "D2" of respective data latches 66 or 67 (DATA LATCH1 or DATA LATCH2), depending on the address select signal appearing at the ADDRESS SELECT bus connection 62. The data latch 67 functions as a switch 67 to either block or unblock an NMI signal appearing at the NMI source port 51 from being applied to the microprocessor device 41. The data latch 66 is an NMI routing switch which directs an NMI signal (other than one blocked by the operation of the data latch 67) to be applied either as a reset signal to the reset port 58, or as an NMI signal to the NMI port 55 of the microprocessor device 41.

Tracing the signals through the switch 50, an NMI signal, as an edge triggering signal, is applied via the NMI port 51 through a first OR-gate 68 to one of the input ports of a second, NMI signal OR-gate 71 and a third, RESET OR-gate 72, respectively. A Q1 data output from the data latch 66 constitutes the other, second OR-gated input to the OR-gate 71. A data output from the output node Q2 of the second data latch 67 is applied as a second OR-gated signal to the OR-gate 68 and thus, as an output OR-gated with an NMI source signal to the OR gates 71 and 72. An inverted data output "not-Q1" of the data latch 66 is applied as a second OR-gated input of the third OR-gate 72. An active low output node 73 from the OR-gate 71 constitutes an NMI signal which appears at the NMI signal line 55 which is also the NMI signal port 55 of the microprocessor device 41 (see FIG. 3). An output node 74 from the OR-gate 72 is applied through a "ONE SHOT" function device 75 to the input port 56 of the AND-gate 57 (see FIG. 3). The ONE SHOT device 75 is a typical pulse-shaping device for converting, in this particular application, an active signal edge to a low RESET signal pulse which is sustained for the desired reset time period of 100 milliseconds, as an example. In general, the conversion of the active edge-triggered signal to a required pulse of a desired sustained length may be adapted to suit the reset needs of the particular microprocessor device 41.

Figure 1:
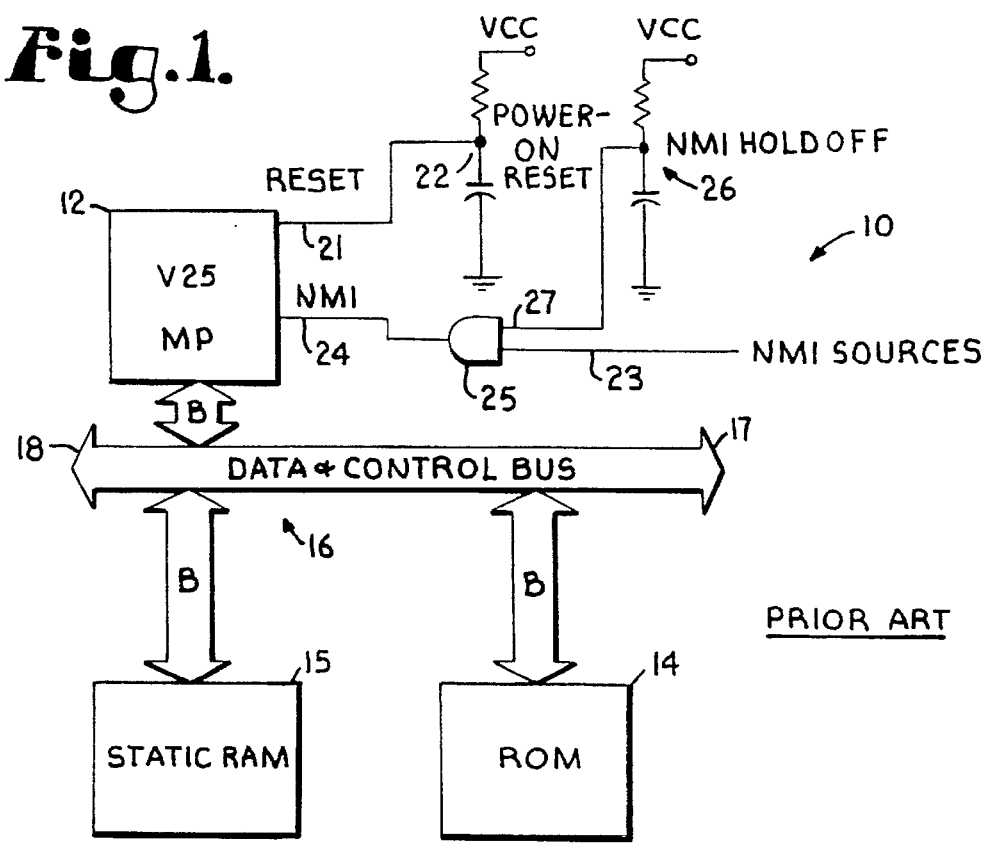
FIG. 1 is a schematic block diagram representing a prior art microprocessor circuit operable with a sleep mode in a memory environment of static RAM (SRAM) devices.
Figure 2:
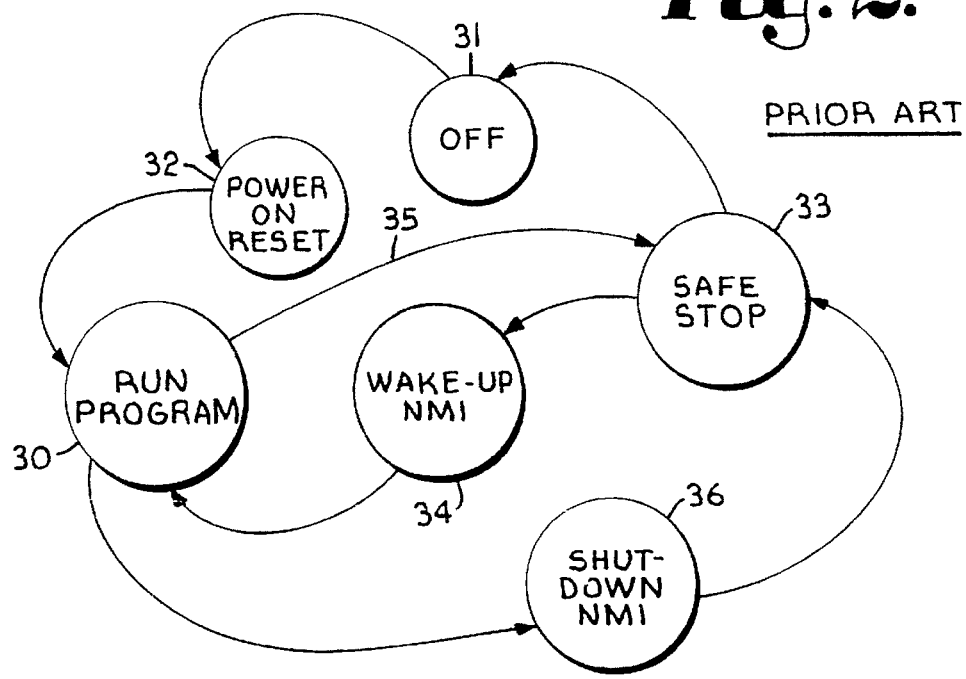
FIG. 2 is a state diagram showing operational states of the prior art microprocessor circuit of FIG. 1.
Figure 5:
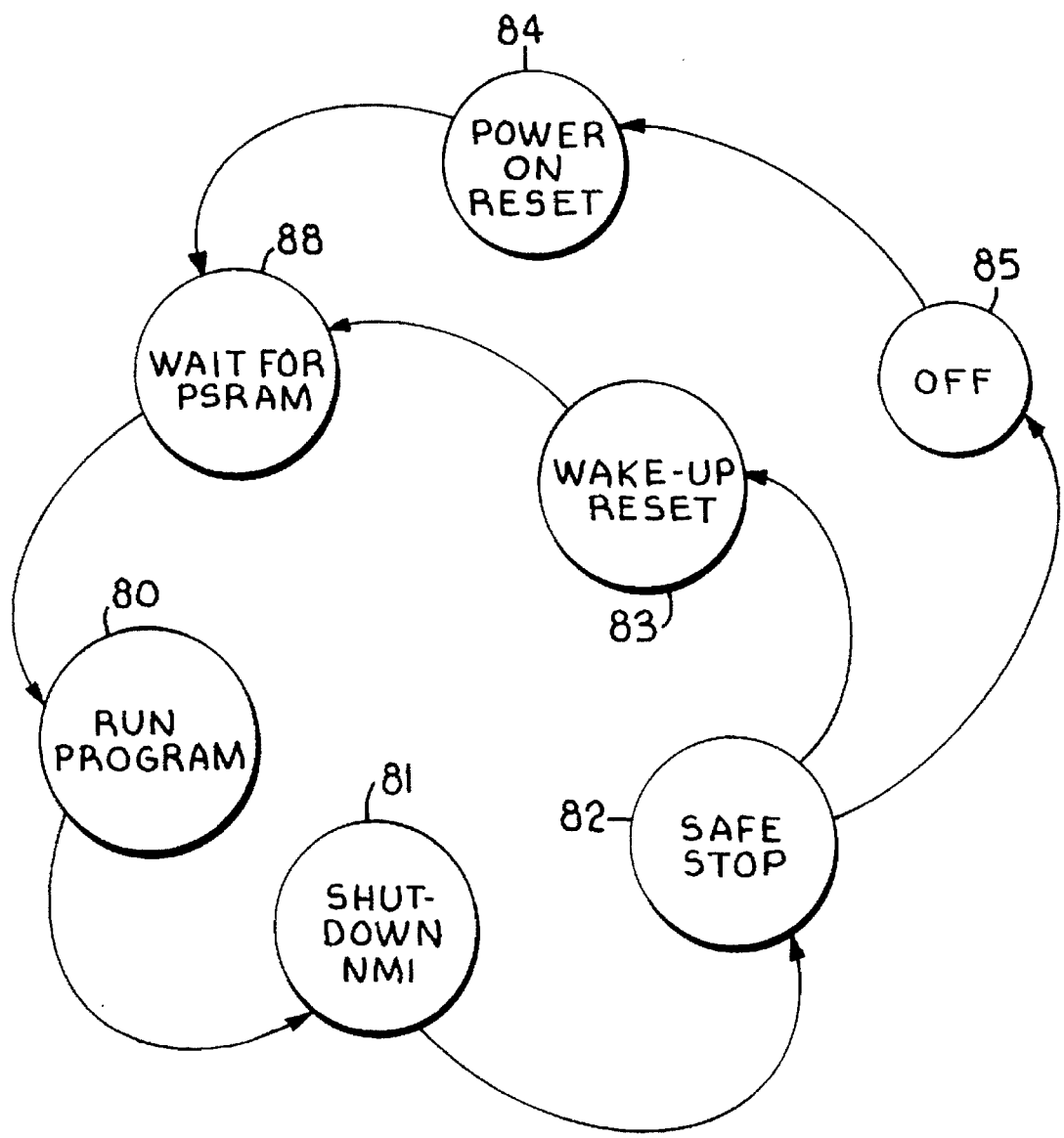
FIG. 5 is a state diagram showing operational states of the microprocessor circuit of FIG. 3, and showing particular operations in accordance with the invention.

Referring now to FIGS. 3 and 5, the use of the intervening NMI switch 50 described in reference to FIGS. 3 and 4, alters start-up procedures of the microprocessor device 41 with respect to the start-up operations of the microprocessor device 12 described with respect to FIGS. 1 and 2. According to the state diagram of FIG. 5, an active operating state includes processing of NMI signals in a routine operating manner. Also, if a shut-down NMI signal is received, as shown by the transition state 81 ("SHUT-DOWN NMI"), the microprocessor circuit is placed into a safe stop mode 82 ("SAFE STOP"), regardless of whether the ensuing state is a total shut-down of the portable data collection terminal 53, or whether the shut-down mode is a contemplated power saving temporary sleep mode. Once in the safe stop state 82, a start-up from the sleep mode generates a wake-up reset state 83 ("WAKE-UP RESET"), according to which the wake-up NMI signal is intercepted by the NMI switch 50 and is converted to a reset signal, as described, which is applied via the AND-gate 57 to the reset port 58 of the microprocessor circuit 41, as if a reset signal had been generated in response to an initial start-up 84 ("POWER-ON RESET"), after a power-off state 85 ("OFF"). In either route, in response to a wake-up NMI or from a complete off state, the microprocessor circuit 40 obtains initial instructions from the ROM memory 46. Addressing the pseudo-static memory 47 is delayed for a period sufficient to return the pseudo-static memory 47 to the external refresh mode through refresh signals generated by the microprocessor and applied by the memory management unit 48. The corresponding memory start-up delay is shown in FIG. 5 by a wait state 88 ("WAIT FOR PSRAM"). Both the power-on reset 84 and the wake-up reset 83 invariably places the microprocessor device 41 into the wait state 88 for the duration of the reset time period.

The operation of the NMI switch 50, consequently, allows the microprocessor circuit 40 to operate with a full complement of pseudo-static memory 47 in an operational mode wherein all NMI signal operation received while the pseudo-static memory 47 is active are executed in a normal interrupt mode. On the other hand, any time an NMI is received while the pseudo-static memory is in a self-refresh mode, a delay is generated by converting the NMI signal to a reset signal to allow the pseudo-static memory to be in an active state at the time when the microprocessor device 41 first resumes operation. An apparent indistinction between the "POWER-ON RESET" condition 84 and the "WAKE-UP RESET" condition or state 83 may be clarified, if so desired, by a data latch which latches, for example, a logical "1" signal to remain high under all conditions except when power is lost to the portable data collection terminal 53. In the preferred embodiment, the microprocessor device 41, which is an NEC V25 device, provides internally a data bit location referred to as standby control bit (STBC) which fulfills the desired condition. Thus, after any reset, ROM instructions may be used to query the "STBC" register of the microprocessor device 41 to determine whether the reset occurred because of an initial power-up operation or because of a power interruption, caused, for example, by replacing a low battery of the portable data collection terminal 53. The data collection terminal 53 may, in the latter case, display an informational message to an operator to query, for example, whether an application program is to resume at a prior point of interruption or whether the unit is to be otherwise initialized. Thus, after a power interruption to the hand-held data collection terminal 53, the software instructions contained within the ROM memory 46 shown in FIG. 3, after causing a display of an appropriate prompt to an operator, may cause a logical "1" to be written to the STBC bit address of the microprocessor device 41.

Though certain variations and modifications have already been referred to or described, it is understood various other changes and modifications in the use and implementation of the described embodiments are possible without departing from the spirit and scope of the invention as set forth in the claims.

What is claimed is:

1. Apparatus for controlling access to pseudo-static memory within which pseudo-static memory data may be stored and from which such stored data may be retrieved during active periods of the pseudo-static memory, the pseudo-static memory remaining addressable and active during periods of externally applied refresh pulses and becoming self-refreshing and non-responsive during periods without externally applied refresh pulses, the apparatus comprising:

a refresh pulse network including a refresh pulse generator and a refresh pulse distributor connectable to pseudo-static memory and including means for applying refresh pulses to such pseudo-static memory to maintain such memory in an active and addressable state;

a control device communicatively connectable to the pseudo-static memory to access the pseudo-static memory in response to receipt of a non-maskable interrupt signal from one of a plurality of NMI sources, and coupled to the refresh pulse distributor to inhibit the refresh pulse distributor from applying refresh pulses from the refresh pulse generator to the pseudo-static memory during an address-inactive state of the pseudo-static memory; and a switching circuit coupled between the control device and an NMI source to intercept a non-maskable interrupt signal to the control device, the switching circuit including a non-maskable interrupt signal routing switch having a first switched output node coupled to an NMI port and having a second switched output node, a pulse-shaping circuit having an input lead coupled to the second switched output node of said routing switch and having an output node coupled to a reset port of the control device, the switching circuit being operative whenever the pseudo-static memory is in an address-inactive state to convert an initial non-maskable interrupt signal occurring at the conclusion of an address-inactive state of the pseudo-static memory to a reset pulse, the reset pulse being routed to the reset port and inhibiting access of the control device during a period within which the pseudo-static memory remains in the address-inactive state.

2. Apparatus according to claim 1, wherein the control device is a microprocessor device.

3. Apparatus according to claim 1, wherein the control device is a microprocessor device, wherein the refresh pulse generator of the refresh pulse network is included within the microprocessor device, and wherein the refresh pulse distributor of the refresh pulse network is a memory management unit coupled to the refresh pulse generator of the microprocessor device.

4. Apparatus according to claim 3, further comprising a data and control bus, and wherein the memory management unit, the data and control bus, the microprocessor device and the switching circuit are comprised within a control circuit of a portable data collection terminal.

5. Apparatus according to claim 4, wherein the plurality of NMI sources includes a keyboard of the portable data collection terminal.

6. Apparatus for controlling access to pseudo-static memory within which pseudo-static memory data may be stored and from which such stored data may be retrieved during active periods of the pseudo-static memory, the pseudo-static memory remaining addressable and active during periods of externally applied refresh pulses and becoming self-refreshing and non-responsive during periods without externally applied refresh pulses, the apparatus comprising:

refresh means for applying refresh pulses to the pseudo-static memory to maintain the pseudo-static memory in an active and addressable state;

access means for accessing the pseudo-static memory in response to receipt of a non-maskable interrupt signal from one of a plurality of NMI sources, said access means coupled to said refresh means to operatively inhibit application of refresh pulses to the pseudo-static memory during an address-inactive state of the pseudo-static memory; and switching means for intercepting a non-maskable interrupt signal from one of the plurality of NMI sources to said access means wherein said switching means is operative, when the pseudo-static memory is in an address-inactive state, to intercept an initial non-maskable interrupt signal occurring at the conclusion of an address-inactive state of the pseudo-static memory, to convert the intercepted non-maskable interrupt signal to a reset pulse, to re-route the reset pulse to the access means, and to continue inhibiting said access means from accessing the pseudo-static memory until the pseudo-static memory is reset to the active and addressable state.

7. A method for controlling access to pseudo-static memory within which pseudo-static memory data may be stored and from which such stored data may be retrieved during active periods of the pseudo-static memory, the pseudo-static memory remaining addressable and active during periods of externally applied refresh pulses, and becoming self-refreshing and non-responsive during periods without externally applied refresh pulses during address-inactive periods of the pseudo-static memory, the method comprising the steps of:

using an access means to access the pseudo-static memory in response to receipt of a non-maskable interrupt signal from one of a plurality of NMI sources when the pseudo-static memory is addressable and active;

inhibiting the access means from accessing the pseudo-static memory during the address-inactive periods;

intercepting a non-maskable interrupt signal from one of the plurality of NMI sources to the access means occurring at the conclusion of an address-inactive period;

converting the intercepted non-maskable interrupt signal to a reset signal; and re-routing the reset signal to the access means.

8. An apparatus having an active configuration and an inactive configuration, from either of which said apparatus is capable of responding to a nonmaskable interrupt ("NMI") signal from a plurality of NMI sources, said apparatus comprising:

(a) first memory means, having pseudo-static memory, for retaining first information for use by said apparatus after said apparatus assumes said active configuration; said first memory means having first refresh means for refreshing said pseudo-static memory when said apparatus is in said inactive configuration;

(b) second memory means, having "permanent" memory, for retaining second information configured to operatively activate said apparatus from said inactive configuration to said active configuration;

(c) second refresh means for refreshing said pseudo-static memory when said apparatus is in said active configuration; and (d) switching means for:

(1) intercepting an NMI signal from one of the plurality of NMI sources when said apparatus is in said inactive configuration and converting said intercepted NMI signal to a reset pulse, (2) re-routing said reset pulse, and (3) delaying accessing of said first memory means in response to said re-routed reset pulse until said apparatus has been activated to said active configuration from said inactive configuration.

9. The apparatus of claim 8, including control device means for accessing and modifying said first information when said apparatus is in said active configuration.

10. The apparatus of claim 9, wherein said switching means is configured to operatively prevent said control device means from accessing and modifying said first information when said apparatus is in said inactive configuration.

11. The apparatus of claim 9, wherein said control device means includes a microprocessor.

12. The apparatus of claim 9, wherein said pseudo-static memory is configured to be responsive to said control device means as said second refresh means is refreshing said pseudo-static memory.

13. The apparatus of claim 9, wherein said pseudo-static memory is configured to be non-responsive to said control device as said first refresh means is refreshing said pseudo-static memory.

14. The apparatus of claim 8, including control device means for accessing said second information as said apparatus is being activated from said inactive configuration to said active configuration.

15. The apparatus of claim 14, wherein said control device means accesses said second information upon receipt of a startup signal by said control device means.

16. The apparatus of claim 15, wherein said switching means causes said control device means to receive said startup signal upon intercepting of the NMI signal by said switching means.

17. The apparatus of claim 8, wherein said inactive configuration includes a safe stop mode resulting from either a total shut-down mode or a temporary power interruption mode of said apparatus.

18. The apparatus of claim 17, including query means for permitting a user of said apparatus to determine whether said apparatus is being activated from said total shut-down mode or from said temporary power interruption mode.

19. The apparatus of claim 18, wherein said query means includes a data latch.

20. The apparatus of claim 19, wherein said data latch includes a standby control bit configured to operatively distinguish between said total shut-down mode and said temporary power interruption mode of said apparatus.

21. The apparatus of claim 17, including query means for permitting a user of said apparatus to selectively activate said apparatus either at the point of the temporary power interruption of an application program of the apparatus or to otherwise initialize said apparatus.

22. The apparatus of claim 8, wherein refreshing of said pseudo-static memory is changed from being refreshed by said first refresh means to being refreshed by said second refresh means after said apparatus has been activated from said inactive configuration to said active configuration.

23. A method for activating an apparatus from an inactive configuration, including a safe stop mode resulting from either a total shut-down mode or a temporary power interruption mode, to an active configuration, wherein said apparatus has a "permanent" memory having start-up instructions, a pseudo-static memory that is internally refreshed as said apparatus assumes said inactive configuration and is externally refreshed when said apparatus is in said active configuration, and a microprocessor capable of accessing the "permanent" memory and the pseudo-static memory, and wherein said apparatus is capable of responding to a non-maskable interrupt ("NMI") signal from a plurality of NMI sources, said method comprising the steps of:

(a) intercepting an NMI signal from one of the plurality of NMI sources and converting the intercepted NMI signal to a reset pulse;

(b) re-routing said reset pulse such that the microprocessor accesses the start-up instructions in response thereto such that the apparatus in activated from the inactive configuration to the active configuration; and (c) delaying accessing of the pseudo-static memory until the apparatus has been activated to the active configuration from the inactive configuration.

24. The method of claim 23, including the step of preventing the microprocessor from accessing the pseudo-static memory as the apparatus assumes the inactive configuration.

25. The method of claim 23, including the step of making the pseudo-static memory non-responsive to the microprocessor as the pseudo-static memory is being internally refreshed.

26. The method of claim 23, including the step of enabling a user of the apparatus to determine whether the apparatus is being activated from the total shut-down mode or from the temporary power interruption mode.

27. The method of claim 23, including the step of enabling a user of the apparatus to selectively activate the apparatus either at the point of the temporary power interruption of an application program of the apparatus or to otherwise initialize said apparatus.

28. The method of claim 23, including the step of changing the pseudo-static memory from being internally refreshed to being externally refreshed after the apparatus is activated from the inactive configuration to the active configuration.

* * * * *